(12) United States Patent
Ho et al.

(10) Patent No.: US 8,890,296 B2
(45) Date of Patent: Nov. 18, 2014

(54) WAFER LEVEL CHIP SCALE PACKAGE (71) Applicants: Yueh-Se Ho, Sunnyvale, CA (US); Yan Xun Xue, Los Gatos, CA (US)

(72) Inventors: Yueh-Se Ho, Sunnyvale, CA (US); Yan Xun Xue, Los Gatos, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/750,944

(22) Filed: Jan. 25, 2013

(65) Prior Publication Data
US 2013/0134502 A1 May 30, 2013

Related U.S. Application Data (63) Continuation of application No. 12/846,743, filed on Jul. 29, 2010, now Pat. No. 8,362,606.

(51) Int. Cl.
H01L 23/495 (2006.01)
(Continued)

(52) U.S. Cl.
CPC ............ H01L 23/485 (2013.01); H01L 2224/94 (2013.01); H01L 29/0657 (2013.01);
(Continued)

(58) Field of Classification Search
CPC .............. H01L 23/485; H01L 29/0653; H01L 29/7802; H01L 29/42372; H01L 29/41741; H01L 29/0657; H01L 21/768; H01L 25/0655; H01L 25/0657; H01L 23/3114; H01L 23/4824; H01L 24/05; H01L 24/03; H01L 24/06; H01L 24/16; H01L 24/48; H01L 2924/10253; H01L 2924/3011; H01L 2924/13055; H01L 2924/01013; H01L 2924/01029; H01L 2924/01079; H01L 2924/01082; H01L 2924/13091; H01L 2924/01005; H01L 2924/01006; H01L 2924/01033; H01L 2924/01075; H01L 2224/73265; H01L 2224/48472; H01L 2224/16145; H01L 2224/06182; H01L 2224/02372; H01L 2224/02371; H01L 2224/131; H01L 2224/17181; H01L 2224/48245; H01L 2224/45144; H01L 2224/94; H01L 2225/06513
USPC .................. 257/329, 666, 676, 678, E23.001; 438/15, 462, 106, 110
See application file for complete search history.

(56) References Cited

U.S. PATENT DOCUMENTS 6,133,634 A 10/2000 Joshi
6,164,523 A 12/2000 Fauty et al.
(Continued)

FOREIGN PATENT DOCUMENTS

JP 09129867 5/1997
WO WO0175961 10/2001

OTHER PUBLICATIONS

Crespo et al., "Ti/Al/Ni/Au Ohmic Contacts on AlGaN/GaN HEMTs", 2003 International Conference on Compound Semiconductor Mfg.

(Continued)

Primary Examiner — Nikolay Yushin
(74) Attorney, Agent, or Firm — Joshua D. Isenberg; JDI Patent (57) ABSTRACT A semiconductor device, a method of manufacturing semiconductor devices and a circuit package assembly are described. A semiconductor device can have a semiconductor substrate with first and second surfaces and a sidewall between them. First and second conductive pads on the first and second surfaces are in electrical contact with corresponding first and second semiconductor device structures in the substrate. An insulator layer on the first surface and sidewall covers a portion of the first conductive pad on the first surface. An electrically conductive layer on part of the insulator layer on the first conductive pad and sidewall is in electrical contact with the second conductive pad. The insulator layer prevents the conductive layer from making electrical contact between the first and second conductive pads.

11 Claims, 11 Drawing Sheets (51) Int. Cl.
*H01L 21/00* (2006.01)
*H01L 29/06* (2006.01)
*H01L 21/768* (2006.01)
*H01L 29/417* (2006.01)
*H01L 25/065* (2006.01)
*H01L 29/78* (2006.01)
*H01L 23/482* (2006.01)
*H01L 23/31* (2006.01)
*H01L 29/423* (2006.01)
*H01L 23/485* (2006.01)
*H01L 23/00* (2006.01)

(52) U.S. Cl.
CPC ..... *H01L 21/768* (2013.01); *H01L 2224/48247* (2013.01); *H01L 2924/13055* (2013.01); *H01L 2924/01082* (2013.01); *H01L 29/41741* (2013.01); *H01L 25/0657* (2013.01); *H01L 2924/01075* (2013.01); *H01L 29/0653* (2013.01); *H01L 24/16* (2013.01); *H01L 2224/17181* (2013.01); *H01L 2924/13091* (2013.01); *H01L 2924/01079* (2013.01); *H01L 2225/06513* (2013.01); *H01L 29/7802* (2013.01); *H01L 24/48* (2013.01); *H01L 24/03* (2013.01); *H01L 2924/01033* (2013.01); *H01L 2224/16145* (2013.01); *H01L 2924/014* (2013.01); *H01L 2224/48245* (2013.01); *H01L 24/06* (2013.01); *H01L 23/4824* (2013.01); *H01L 24/05* (2013.01); *H01L 2224/02371* (2013.01); *H01L 2924/3011* (2013.01); *H01L 2924/10253* (2013.01); *H01L 2924/01006* (2013.01); *H01L 23/3114* (2013.01); *H01L 2224/06182* (2013.01); *H01L 2924/01029* (2013.01); *H01L 2224/02372* (2013.01); *H01L 2224/48472* (2013.01); *H01L 2224/131* (2013.01); *H01L 29/42372* (2013.01); *H01L 2224/73265* (2013.01); *H01L 25/0655* (2013.01); *H01L 2924/01005* (2013.01); *H01L 2924/01013* (2013.01); *H01L 2224/45144* (2013.01)
USPC .......................................... 257/676; 438/110

(56) References Cited

U.S. PATENT DOCUMENTS

| | | | |
|---|---|---|---|
| 6,271,060 | B1 | 8/2001 | Zandman et al. |
| 6,316,287 | B1 | 11/2001 | Zandman et al. |
| 6,355,502 | B1 | 3/2002 | Kang et al. |
| 6,469,384 | B2 | 10/2002 | Joshi |
| 6,562,647 | B2 | 5/2003 | Zandman et al. |
| 6,646,329 | B2 | 11/2003 | Estacio et al. |
| 6,653,740 | B2 | 11/2003 | Kinzer et al. |
| 6,767,820 | B2 | 7/2004 | Standing et al. |
| 7,955,893 | B2 | 6/2011 | Feng |
| 8,362,606 | B2 | 1/2013 | Ho et al. |
| 2002/0019069 | A1 | 2/2002 | Wada |
| 2003/0052405 | A1 | 3/2003 | Moriguchi |
| 2003/0067071 | A1 | 4/2003 | Cardwell |
| 2003/0207546 | A1 | 11/2003 | Wajima |
| 2004/0221451 | A1 | 11/2004 | Chia et al. |
| 2008/0274603 | A1 | 11/2008 | Do et al. |
| 2009/0194880 | A1 | 8/2009 | Feng et al. |

OTHER PUBLICATIONS

Final Office Action dated Jul. 2, 2012 for U.S. Appl. No. 12/846,743 13 pages.
Non Final Office Action dated Feb. 22, 2012 for U.S. Appl. No. 12/846,743 9 pages.
Office Action dated Jul. 5, 2011 issued for U.S. Appl. No. 13/007,356, filed Jan. 14, 2011.
Office Action dated Sep. 1, 2010 issued for U.S. Appl. No. 12/023,921, filed Jan. 31, 2008.
PCT International Search Report dated Jul. 27, 2009 for International Patent Application No. PCT/US2009/032242.

WAFER LEVEL CHIP SCALE PACKAGE

This application is a continuation of and claims the priority benefit of commonly owned, co-pending U.S. patent application Ser. No. 12/846,743, to Yueh-Se Ho, and Yan Xun Xue, filed Jul. 29, 2010, and entitled "WAFER LEVEL CHIP SCALE PACKAGE" the entire disclosures of which are incorporated herein by reference.

FIELD OF THE INVENTION

This invention generally relates to semiconductor packaging and more specifically relates to a low cost process of wafer level chip scale package (WLCSP).

BACKGROUND OF THE INVENTION

A low package resistance and good thermal performance is often desirable for semiconductor devices. This is particularly the case for metal oxide semiconductor field effect transistor (MOSFET) devices, especially vertical conduction power MOSFET devices having gate and source electrodes on one surface of a semiconductor chip and a drain electrode on the opposite surface (as opposed to lateral device devices which have all the electrodes on the top surface). It is also generally desirable to have simple, quick and efficient methods of packaging semiconductor devices. Thus, numerous packaging concepts and methods have been developed in the prior art.

While silicon process technology has advanced significantly in the past decade, for the most part, the same decades-old packaging technology continues as the primary packaging means. Epoxy or solder die attachment along with aluminum or gold wire bonding to a lead frame is still the dominant semiconductor packaging methodology. Advances in semiconductor processing technology, however, have made parasitics (e.g., resistances, capacitances and inductances) associated with conventional packaging techniques more of a performance-limiting factor. In addition, there is a constant demand for ever shrinking package sizes. To best utilize space, the total package footprint is desired to be as close to the semiconductor die size as possible. In the case of conventional flip chip technology, among other shortcomings, electrical connection to the back surface of a vertical conduction die is not easily facilitated without taking up a large amount of space, in addition to extra assembly time. These limitations become quite significant in high current applications such as power switching devices.

U.S. Pat. No. 6,271,060 discloses a process of fabricating a package for a semiconductor device including a metal layer which wraps around the edges of the die to form an electrical connection between a location on the front side of the die and the conductive substrate at the back side. The package is essentially the same size as the die. Initially, a conductive substrate is attached to the back side of a wafer and is in electrical contact with a terminal on the back side of each die in the wafer; a nonconductive overcoat is formed and patterned on the front side of the wafer, leaving a portion of the passivation layer and the connection pads for the dice exposed, each of the connection pads being coated with a solderable metal layer. The assembly is then sawed in perpendicular directions along the scribe lines between the dice, but the saw cuts do not extend all the way through the substrate, which remains intact at its back side. The parallel cuts in one direction are broken to produce die strips which are mounted, sandwich-like, in a stack, with one side of the strips exposed. A metal layer is sputtered or evaporated on one side of the stack; the stack is turned over and a similar process is performed on the other side of the stack. The resulting metal layers are deposited on front side of the die and extend along the edges of the die to the edges and back side of the substrate. The metal is not deposited on the surfaces of the overcoat. The strips in the stack are then separated, and the saw cuts in the perpendicular direction are broken to separate the individual dice. A thick metal layer is plated on the sputtered or evaporated layers to establish a good electrical connection between the front side and the terminal on the back side of each die. In an alternative embodiment, a nonconductive substrate is used and vias are formed in the substrate and filled with metal to make electrical contact with the terminal on the back side of the die.

U.S. Pat. No. 6,316,287 discloses a method of fabricating a package for a semiconductor device. The method includes forming a metal layer in contact with a connection pad on the front side of a semiconductor die while the die is still a part of a wafer. The metal layer extends into the scribe line between the die and an adjacent die. A nonconductive cap is attached to the front side of the wafer, and the wafer is ground from its back side to reduce its thickness. A cut is made from the back side of the wafer, preferably by sawing and etching, to expose the metal layer. A nonconductive layer is formed on the back side of the wafer and a second metal layer is deposited over the nonconductive layer, the second metal layer extending into the scribe line where it makes contact with the first metal layer through an opening in the nonconductive layer. Preferably, a solder post is formed on the second metal layer to allow the finished package to be mounted on a printed circuit board. The cap is then sawed along the scribe line with a saw whose kerf is small enough not to sever the contact between the metal layers. The dice are thereby completely detached from each other, forming individual semiconductor device packages.

U.S. Pat. No. 6,562,647 discloses a semiconductor package by which contacts are made to both sides of the dice is manufactured on a wafer scale. The back side of the wafer is attached to a metal plate. The scribe lines separating the dice are saw cut to expose the metal plate but the cuts do not extend through the metal plate. A metal layer, which may include a number of sublayers, is formed on the front side of the dice, the metal covering the exposed portions of the metal plate and extending the side edges of the dice. Separate sections of the metal layer may also cover connection pads on the front side of the dice. A second set of saw cuts are made coincident with the first set of saw cuts, using a blade that is narrower than the blade used to make the first set of saw cuts. As a result, the metal layer remains on the side edges of the dice connecting the back and front sides of the dice (via the metal plate). Since no wire bonds are required, the resulting package is rugged and provides a low-resistance electrical connection between the back and front sides of the dice.

The wafer level chip scale package such as those disclosed in the preceding prior art package designs is popular in small mounting space, for vertical structure power MOSFET, usually extending the Drain to the Source and Gate surface so as to locate all gate and Source as well as Drain electrodes on same surface. However, this structure is has difficulties with board level mounting and inspection due to all the electrodes not being visible from a side view. Also the disclosed prior arts require the use of an additional supporting substrate, or are not truly wafer level processes.

It is within this context that embodiments of the present invention arise.

BRIEF DESCRIPTION OF THE DRAWINGS

Other objects and advantages of the invention will become apparent upon reading the following detailed description and upon reference to the accompanying drawings in which:

FIGS. 3A through 6A and 7A are perspective views from the front surface (source and gate surface) of a semiconductor device respectively showing a process of manufacturing of wafer level chip scale package of a semiconductor device of the type shown in FIGS. 2A-2B according to an embodiment of the present invention.

FIGS. 3B through 6B and 7B are perspective views from the back surface of the semiconductor device during certain stages of the process of manufacturing depicted in FIGS. 3A through 6A.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

Introduction

Figure 1A:
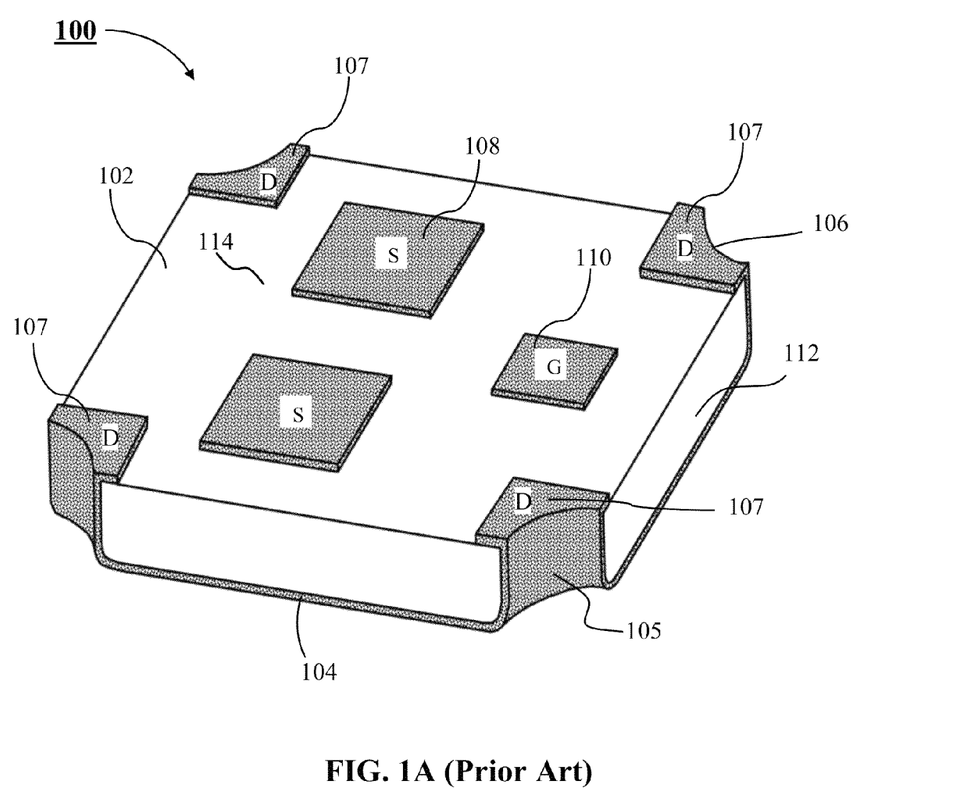
FIG. 1A is a perspective view from a front surface (source and gate surface) of a semiconductor device of the prior art.
Figure 1B:
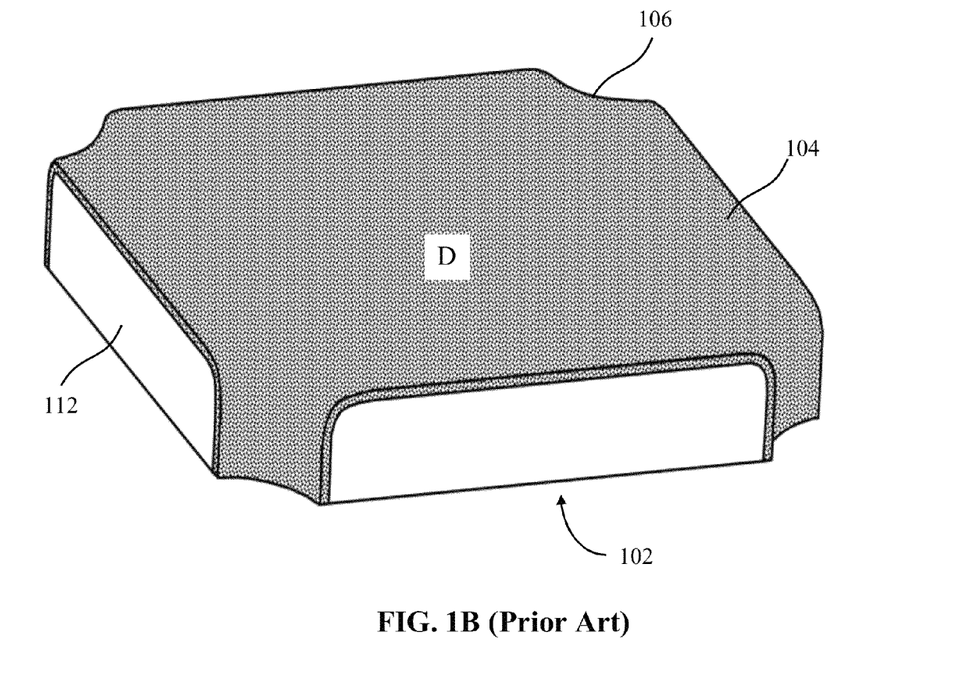
FIG. 1B is a perspective view form a back surface (drain surface) of the semiconductor device of FIG. 1A.

US publication number 2009/0194880 of the same assignee discloses a power wafer level chip scale package for a vertical power MOSFET that includes all source, gate and drain electrodes located on one surface of the device, which is convenient for mounting to a printed circuit board (PCB), e.g., with solder paste. FIGS. 1A-1B are perspective views from the front surface and the back surface, respectively, of a semiconductor device 100. As shown in FIG. 1A, source electrodes (S) 108 and gate electrode (G) 110 are located at the front surface of the device 100, connecting to an underlying source pad and a gate pad through opening windows on a passivation layer 102, which is deposited on a substrate 112 made of a semiconductor material, such as silicon. The source pad and gate pad are connected to the source regions and gate regions on the front surface of the vertical power MOSFET with a drain region normally located at the backside of the device 100. As shown in FIG. 1A, drain electrodes (D) 107 may be located at the trimmed corners 106 at the front surface of the device 100. The drain electrodes (D) 107 are electrically connected to a drain region proximate the backside of the device 100 by an electrically conductive layer 104 on the backside and over the sidewalls 105 of the substrate 112 at the trimmed corners 106 as shown in FIGS. 1A-1B. The drain electrodes 107 may be configured such that they extend over a portion of active device area 114 of the device covered by passivation 102 at the front surface. The drain electrode (D) 107 is formed by forming through holes through a wafer containing a plurality of semiconductor dies, at corner intersections between the semiconductor dies and then forming a conductive layer on the bottom surface of the wafer and on the side walls of the through holes reaching the front surface of the wafer. However, the semiconductor device 100 only has the gate, source and drain electrodes on one surface of the device and not all of the electrodes can be viewed from the side, which makes board level mounting and inspection difficult.

Embodiments

In embodiments of the present invention, these disadvantages can be overcome by a semiconductor device having a semiconductor substrate with first and second surfaces and a sidewall between them. First and second conductive pads on the first and second surfaces are in electrical contact with corresponding first and second semiconductor device structures in the substrate. A notch is formed on the sidewall running from the first surface to the second surfaces. An insulator layer on the first surface and sidewall of the notch covers a portion of the first conductive pad on the first surface and covers the sidewall of the semiconductor substrate. An electrically conductive layer on part of the insulator layer on the first conductive pad and sidewall is in electrical contact with the second conductive pad. The insulator layer prevents the conductive layer from making electrical contact between the first and second conductive pads, and between the electrodes and the semiconductor substrate sidewall.

In some embodiments, a portion of the electrically conductive layer on the sidewall can be exposed to allow electrical contact to or inspection of electrical contact to the second conductive pad to be made from the side of the device via the exposed portion.

Embodiments of the present invention include implementations in which a vertical field effect transistor device has gate, source and drain electrodes accessible on both first and second surfaces of the device. Such a device can be formed by forming through holes in the wafer scribe lines nearby the gate, source and drain regions.

Figure 2A:
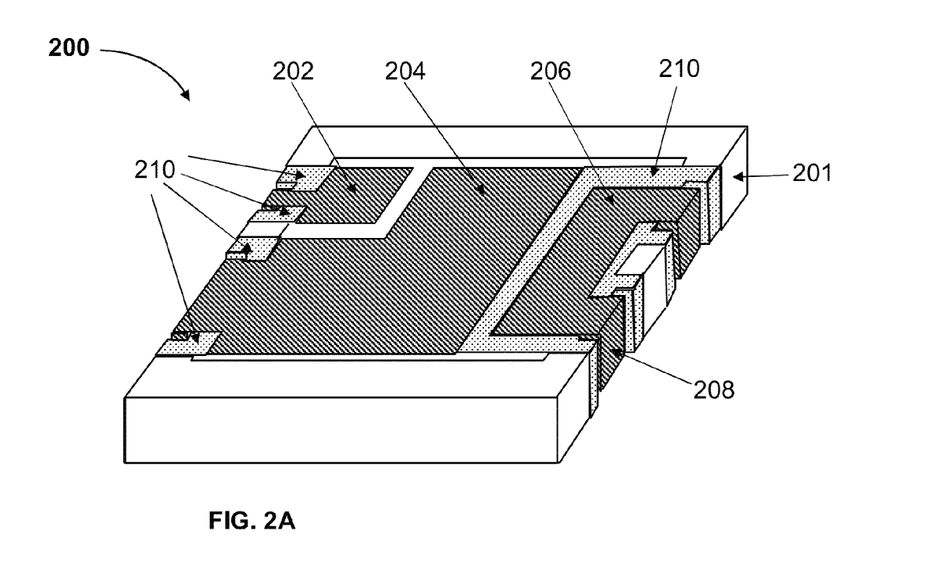
FIG. 2A is a perspective view from a front surface (source and gate surface) of a semiconductor device according to an embodiment of present invention.
Figure 2B:
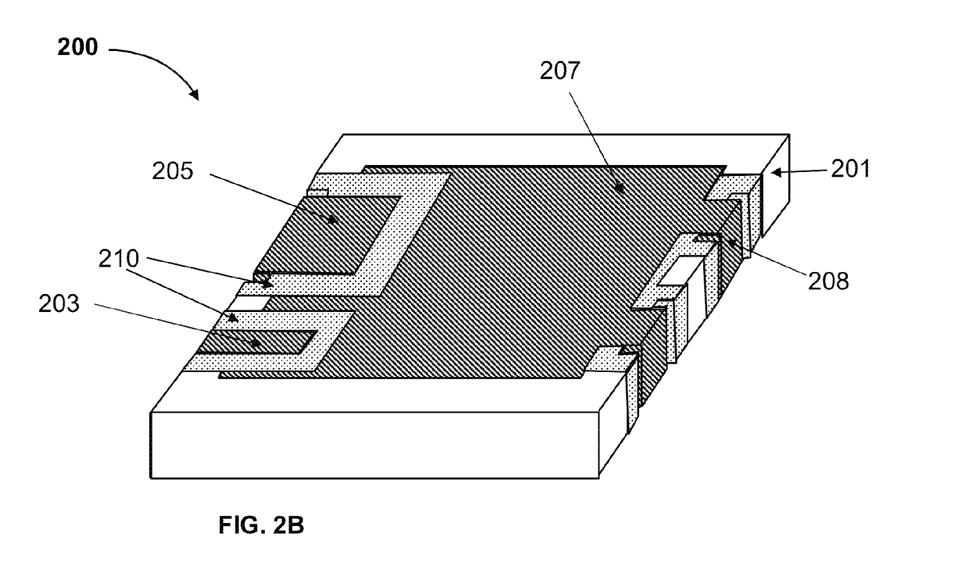
FIG. 2B is a perspective view from a back surface (drain surface) of the semiconductor device of FIG. 2A.

FIGS. 2A-2B are perspective views from a front surface (source and gate surface) and from a back surface (drain surface), respectively, of a semiconductor device 200 according to an embodiment of present invention. A gate front pad 202 and source front pad 204 are formed on a front surface of a substrate 201. A drain pad 207 can be formed on a back surface of the substrate 201.

The gate, source and drain electrodes can be in electrical contact with corresponding device structures in the substrate 201. Specifically, the gate front pad 204 can be in electrical contact with a gate structure formed in the substrate 201. The gate structure may include one or more electrically conductive gates formed within the substrate and electrically isolated from the material of the substrate. The gates may be electrically connected to gate runners that run horizontally though the substrate and are electrically insulated from the material of the substrate. The gate runners may be electrically connected to the gate electrode by conductive contacts that run vertically through the substrate and are electrically insulated from the material of the substrate. The source front pad 204 may be electrically connected by vertical contacts to one or more source regions formed within the substrate 201. Each source region may be formed, e.g., by selective doping of regions of the substrate proximate each of the gates. The gate front pad 202 and source front pad 204 may be located on a front, or top, surface of the device. The drain electrode 207 may be in electrical formed in direct contact with a bottom portion of the substrate that can be doped to act as a drain region. The semiconductor device may be a vertical device, meaning the main electrical current flows vertically from the source at a first (e.g. top) surface to the drain and a second (e.g. bottom) surface of the substrate 201.

One or more of the gate, source and drain electrodes makes electrical contact to a corresponding conductive pad located on the opposite surface of the substrate 201 via a conductive layer formed on a portion of a sidewall of the substrate 201. Specifically, the drain pad 207 on the back surface can be electrically connected to a corresponding front drain contact 206 on the front surface via a side drain contact 208 formed from part of a conductive layer on a sidewall of the device 200. The front gate pad 202 and front source pad 204 on the front surface can be electrically connected to corresponding back contacts 203, 205 respectively on the back surface by similar conductive source and gate side contacts (not shown) on the left side sidewalls of the device.

The combination of the front gate pad 202, side gate contact and back gate contact 203 are sometimes referred to herein as a gate electrode. The combination of the front source pad 204, side source contact and back source contact 205 are sometimes referred to herein as a source electrode. Similarly, the combination of the drain pad 207, side drain contact 208 and the back drain contact 206 are sometimes referred to herein as a drain electrode. The pads, opposite surface contacts, and side contacts for each electrode may be regarded as different portions of that electrode.

Insulating material 210 formed on a portion of the top source pad 204 and on the right side sidewalls of the device, underneath the side drain contact 208 and drain pad 206, protects against the side drain contact 208 undesirably short circuiting the source electrode and drain electrode, while still allowing a source metal that forms the source pad 204 to fully cover a large active area of the die for more efficient use of the die area. In a like manner, insulating material 210 formed over a portion of the bottom drain pad 207 and underneath the bottom surface gate pad 203 electrode and bottom surface source pad 205 electrode and on the left side sidewalls of the device 200 to protect against undesired short circuits between the drain electrode and the gate electrode or source electrode. The insulating material also protects against undesired short circuits between the gate electrode and source electrode and the sidewalls of the semiconductor substrate 201. The insulating material 210 and conductive material on the sidewalls can be formed in notches. The notches run along the sidewalls from the top surface to the bottom surface of the semiconductor substrate 201, but do not run across the entire length of the semiconductor substrate 201. More than one notch can be formed for an electrode, as shown for the drain electrode 207. Thus contact to source, gate and drain structures formed within the substrate 201 is allowed from both the top and the bottom surfaces of the device 200. Although, FIGS. 2A-2B only show the notches containing the connecting conductive layer formed along two (left and right) sidewalls of the device, it should be clear that they can also be formed along the other sidewalls as well.

As shown in FIGS. 2A-2B, the sidewall portions of the conductive layers that form the side drain contact 208 and side source and gate contacts can be exposed to allow electrical contact or visual inspection thereof to be made to the gate, source and drain electrodes from the side of the device 200.

Figure 2C:
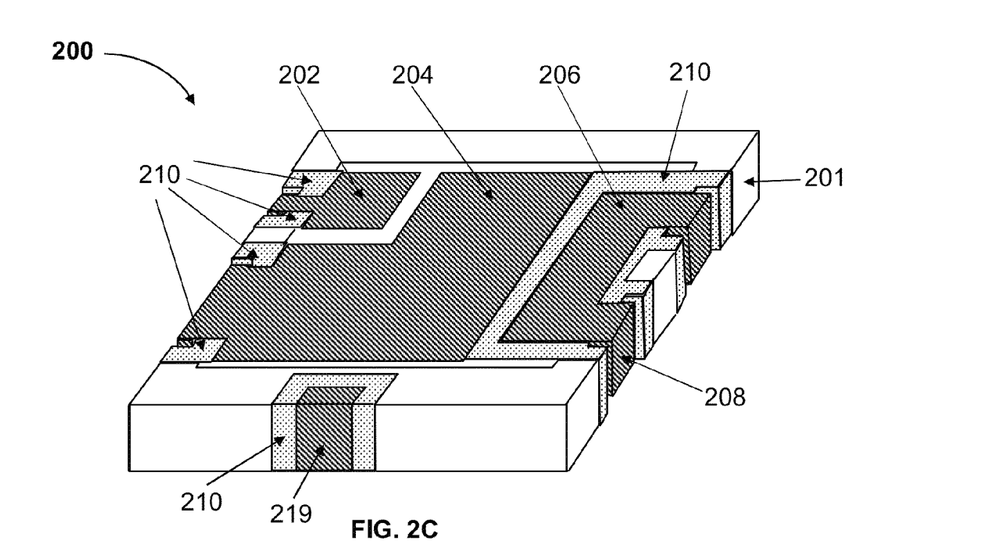
FIGS. 2C and 2D are perspective views of a front and a back surface, respectively, of an alternative embodiment of the semiconductor device of FIGS. 2A-2B.
Figure 2D:
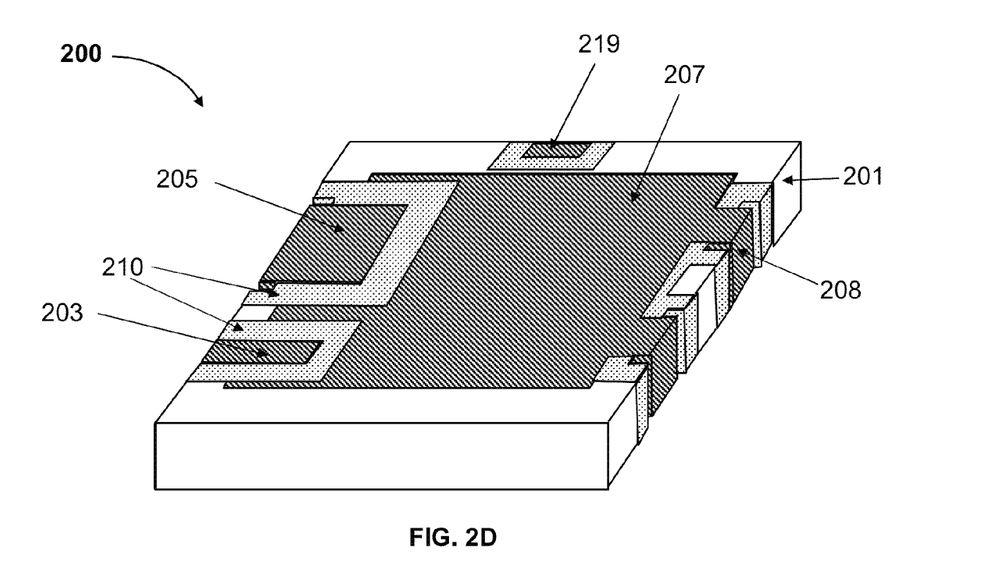

FIG. 2C and FIG. 2D are top and bottom perspective views from the front surface and the back surface, respectively, of an alternative embodiment of this invention. They are largely the same as FIGS. 2A and 2B, except for the inclusion of a re-routing electrode 219. The re-routing electrode 219 has a similar construction to the electrodes, pads, side contacts, and conductive layers described above for source, gate and drain, but it is electrically isolated from the semiconductor substrate and the source, gate and drain electrodes by insulating layer 210. It can be used for re-routing electrical connections from the top to the bottom of the chip. For example that electrical connection could be from another device (e.g. a second MOSFET, a capacitor, IC chip, etc) stacked on top of the device 200. The sidewall portions of the re-routing electrode 219 can also be located in a notch, as described above.

FIGS. 3A-7A and FIGS. 3B-7B are perspective views from the front surface and from the back surface of the semiconductor device, respectively, showing a process of wafer level manufacturing the chip scale package of the vertical power MOSFET of FIGS. 2A-2B according to an embodiment of the present invention.

Figure 3A:
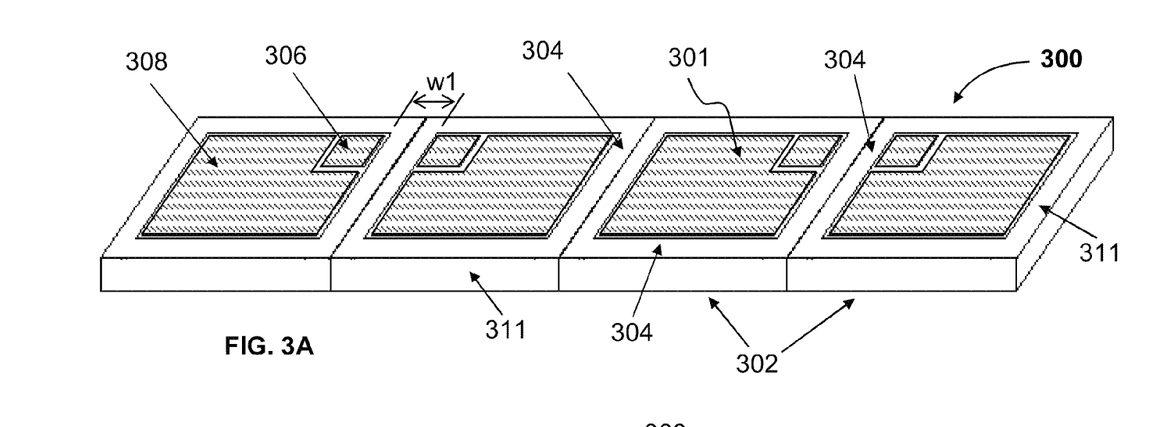
Figure 3B:
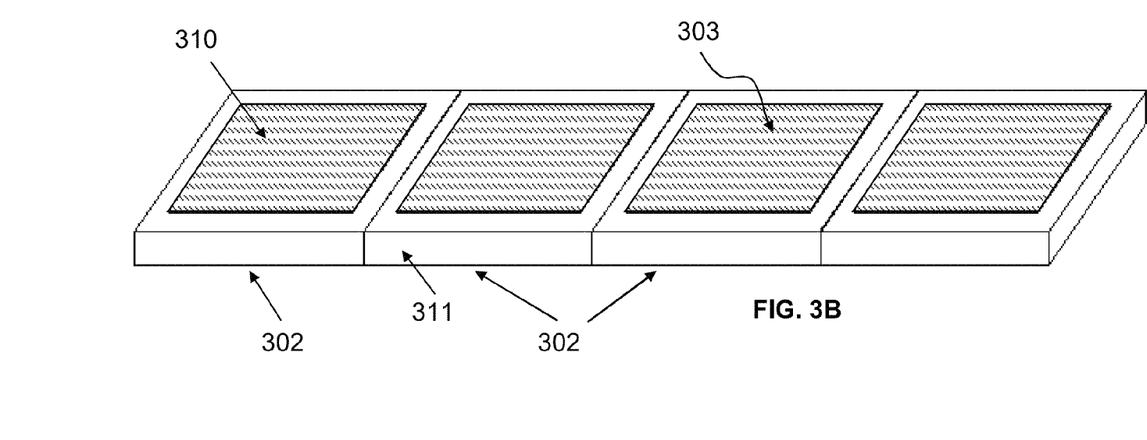

FIGS. 3A and 3B show front and back views, respectively, of a rectangular section 300 of a semiconductor substrate 311 containing a plurality of device structures 302 fabricated on it. By way of example, the substrate may be a semiconductor wafer, such as a silicon wafer, comprising a plurality of semiconductor dies. The wafer may hold many sections like rectangular section 300 in a continuous grid. The semiconductor dies 302 are separated by scribe lines regions 304 (though the dies have not been singulated yet), each of which can have a width w1 of about 60 to 80 microns. Each of semiconductor die 302 includes a gate pad 306 and a source pad 308 on a front surface 301 and a drain pad 310 on a back surface 303.

Figure 4A:
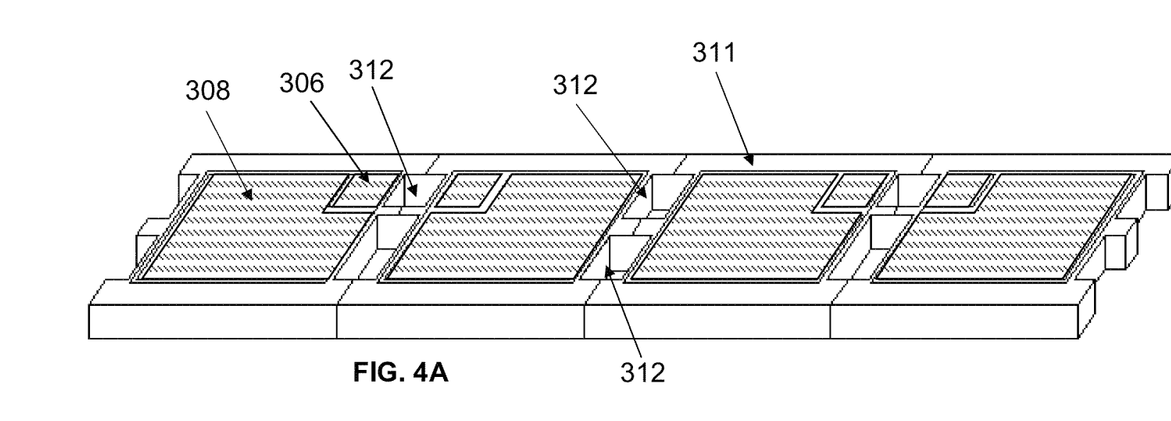
Figure 4B:
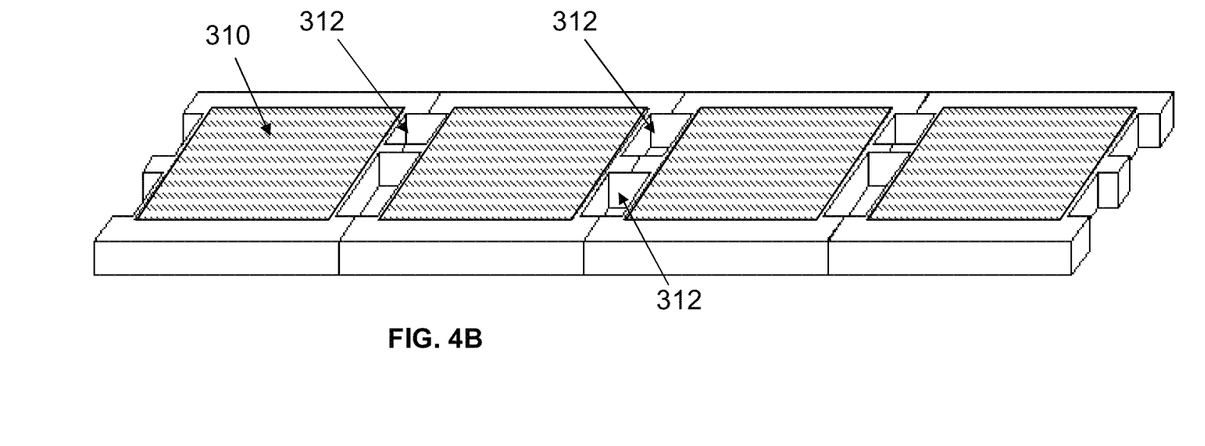

Through holes 312 may be formed through the substrate 311 at intervals in the scribe lines regions 304 nearby gate, source, drain pads 306, 308, 310 as shown in FIG. 4A and FIG. 4B. The through holes can have various shapes, including ovals, rectangles, circles, etc. Also multiple through holes can be made for one electrode, such as the through holes for the drain in FIGS. 4A-4B. The through holes 312 may be formed by either wet etch or dry etch. The pitch of the through holes 312 is selected so that it is large enough, e.g., about 30 to 50 microns, to prevent an electrical short for the device while doing the singulation of the semiconductor dies. The size of the through holes is selected to allow sufficient space for the subsequent steps of forming insulating layers and metallization in the through holes. The through holes 312 do not extend across the entire length of a die and so do not separate the substrate 311 into individual dies or sections at this point. Consequently, the substrate 311 can be processed further as a whole wafer without having to attach it to a support substrate.

Figure 5A:
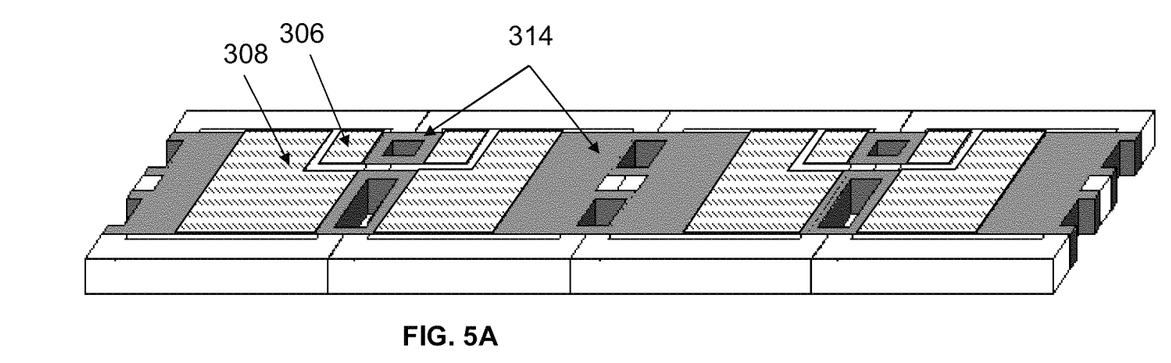
Figure 5B:
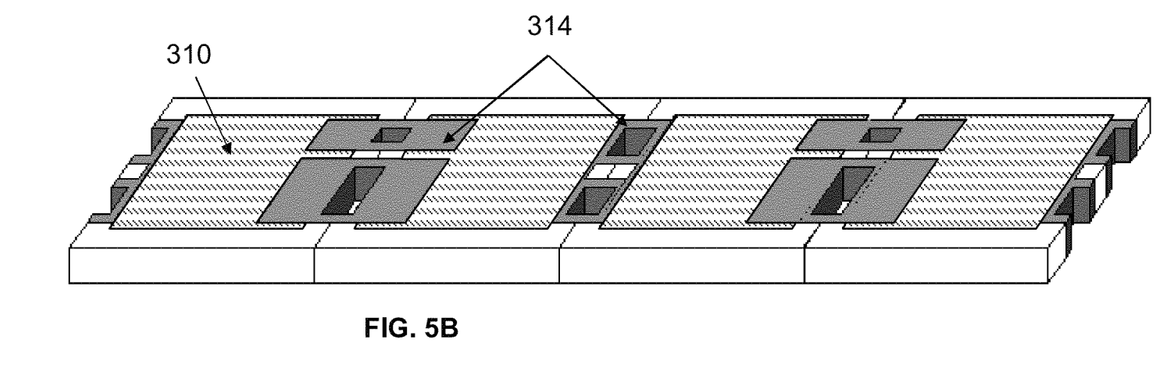

An insulating layer 314 is deposited on the sidewall of the through holes 312 and portions on the front surface 301 and back surface 303 of the dies adjacent to the sidewalls to electrically insulate the side walls of the through holes 312 from parts of the source pad 306, gate pad 308 and drain pad 310 as shown in FIGS. 5A and 5B. In a typical vertical FET, the sidewalls of the semiconductor substrate 311 (which are exposed by through holes) are at drain potential, so it is especially important to insulate the source and gate from the semiconductor substrate sidewalls. The insulating layer 314 can also provide a place for an eventual top drain contact to be located over a portion of the source metal 308, and for the eventual gate and source bottom contacts to be located over a portion of the drain metal 310, thus no active area needs to be sacrificed to allow connection to the electrodes to be made from both top and bottom surfaces of the device. The insulating layer 314 may include oxide, such as phosphosilicate glass (PSG), a nitride or other suitable material. A thickness of the insulating layer 314 can be about 3-4 microns. A patterned mask, e.g., a photoresist mask can be used to pattern the insulating layer 314.

Figure 6A:
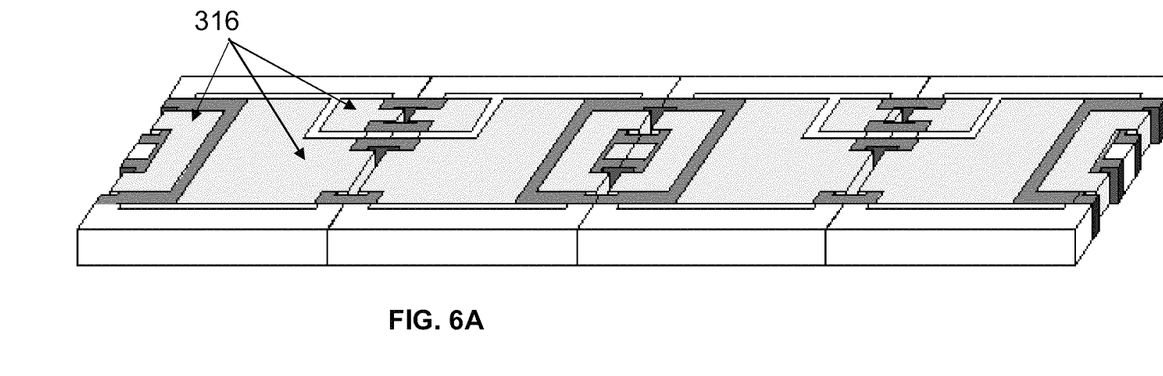
Figure 6B:
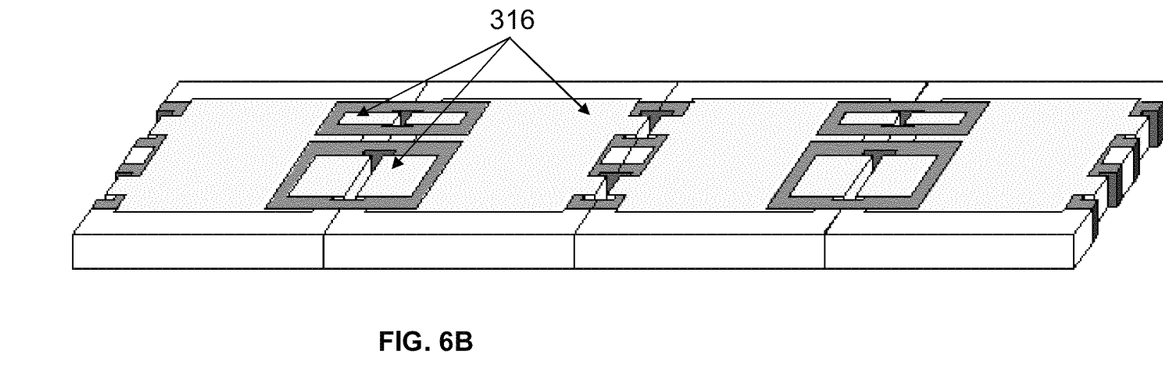
Figure 6C:
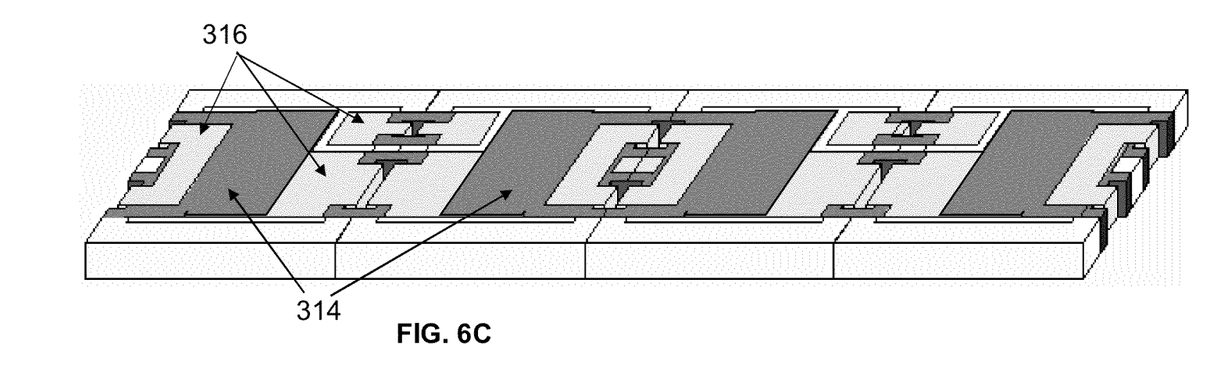
FIGS. 6C-6D are perspective views from the front surface and back surface of a semiconductor device illustrating an alternative embodiment of certain stages of the manufacturing process depicted in FIGS. 6A-6B.
Figure 6D:
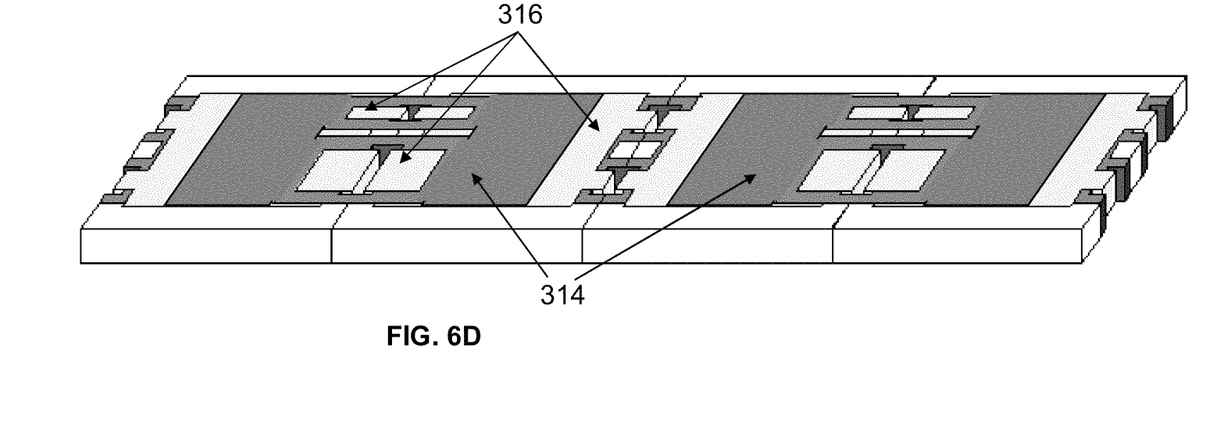

A conductive layer 316, e.g., a second layer of metal, such as an aluminum-copper alloy (AlCu), can then be formed over selected portions of the insulating layer 314 on the front surface 301 and the back surface 303 of the devices 302 and into through holes 312 to provide electrical connections for the gate, source and drain pads to their opposite surface contacts by coating the sides of the through holes 312 as shown in FIGS. 6A-6B. A patterned mask, e.g., a photoresist mask can be used to pattern the metal layer 316. By way of example, and not by way of limitation, the metal may be deposited by physical vapor deposition (PVD) through openings in the patterned mask (e.g., a developed photoresist) to deposit the conductive layer 316 onto selected portions of the insulating layer 314. By way of example, the metal of conductive layer 316 may fully cover the exposed portions (exposed with regards to FIG. 5A-5B) of the first metal layers of the gate, source, and drain pads 306, 308, 310. In an alternative embodiment, the metal of conductive layer 316 may only cover portions of the first metal layers of the gate, source, drain pads 306, 308, 310, while leaving other portions of the source and drain pads 308, 310 covered only by an insulative layer 314, as shown in FIGS. 6C and 6D.

Figure 7A:
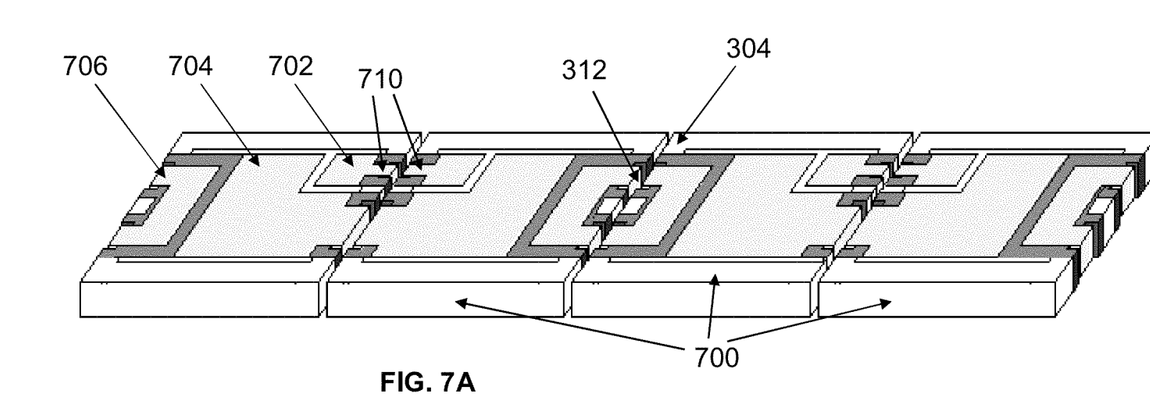
Figure 7B:
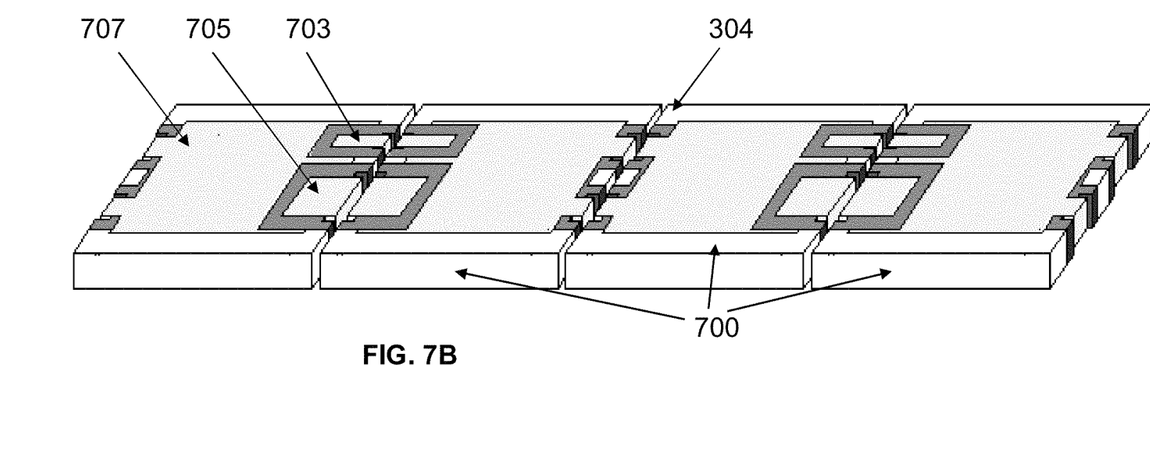

The wafer may then be diced to form individual devices 700 as shown in FIGS. 7A-7B. The dicing process cuts through the center of the through holes 312 along the scribe line regions 304. The wafer singulation (e.g., dicing) turns a through hole 312 into notches 710 in the sidewalls of each semiconductor die. The notches contain insulating material and conductive material for connecting the pads to the corresponding contacts on opposite surfaces. If the pitch of the holes 312 along the scribe lines is large enough, it is possible to avoid undesirable short circuiting in the dicing process, e.g. from metal smearing during a wafer dicing process. In addition, a brief etch may be performed to avoid short circuiting from metal to semiconductor substrate sidewalls or between electrodes. As shown in FIG. 7A, the front surface of the device 700 includes a gate pad 702, a source pad 704 and a drain contact 706. The back surface of the device 700 also includes a gate contact 703, a source contact 705 and a drain pad 707 as shown in FIG. 7B.

Embodiments of the present invention avoid the use of extraneous substrates, such as caps or other structures, or post singulation manufacturing steps to provide contact between the front and back sides of a semiconductor device chip. Embodiments of the present invention allow electrical contact to be made on both front and back sides of a semiconductor device while the device is still part of a wafer and before the wafer is singulated into individual device chips. Embodiments of the present invention can also provide a device structure having exposed metal contacts that are accessible from the sides of the device substrate. This allows the connections to be viewed and inspected from the side of the die and also allows connections to be made to the side of the die, if desired. Because connections to the electrodes can be made on both top and bottom surfaces of the die, additional configurations, such as stacking dies in parallel or in series are possible.

Embodiments of the present invention are particularly advantageous in power MOSFET applications. For example, conventional DC-DC power converters using MOSFET power devices often require a high-side NMOSFET and a low-side NMOSFET. Conventional vertical MOSFET devices are bottom drain. In power converter package, the high-side source and the low-side drain are typically connected to each other with additional bond wires and the low-side source may be electrically coupled to a lead frame. Embodiments of the present invention with the gate, source and drain electrodes on both sides of the device, and which can be contacted from the side of the device, allow stacked co-packaging of high-side (HS) and low-side (LS) MOSFETs to form a DC-DC power converter half bridge, or stacking multiple MOSFET dies connected in parallel to improve the on-resistance ($R_{on}$), as well as stacking a capacitor on the DC-DC power converter to enhance performance in model and board level.

In addition to MOSFETS, other types of devices could be made using the technique described herein. Embodiments of the invention can be applied to any sort of vertical device with electrodes on both sides of the device including, insulated gate bipolar transistor (IGBT), vertical bipolar junction transistor (BJT), power diodes, etc.

Figure 8A:
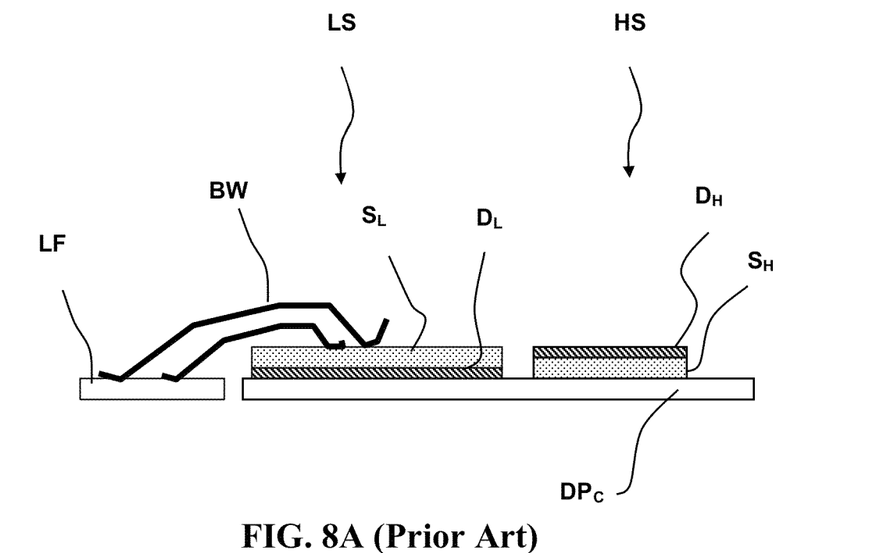
FIG. 8A is a side view of a prior art example of co-packaged high side and low side MOSFETs.
Figure 8B:
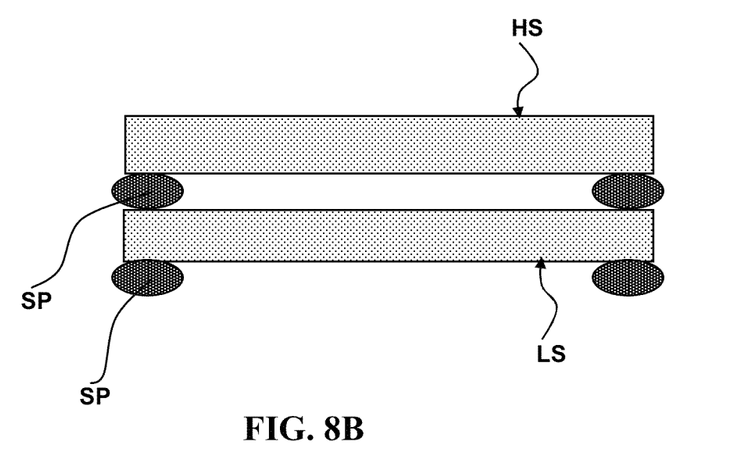
FIG. 8B is a side view of stacked high side and low side MOSFETs according to an embodiment of the present invention.

Advantages of embodiments of the present invention can be understood with reference to FIG. 8A and FIG. 8B. The cross-sectional diagram of FIG. 8A illustrates one prior art co-packaging assembly of a high-side NMOSFET HS and a low-side NMOSFET LS. As shown in FIG. 8A, the high-side NMOSFET HS and a low-side NMOSFET LS are located on a common die pad $DP_C$ with the source $S_H$ of the high-side NMOSFET and the drain $D_L$ of the low-side NMOSFET facing the common die pad $DP_C$. A source $S_L$ of the low-side NMOSFET may be electrically coupled to a lead frame LF by bond wires BW. However, this is not as space-efficient as a stacked structure, and requires a bottom source MOSFET device be designed for the high-side NMOSFET HS.

The cross-sectional diagram of FIG. 8B illustrate an advantage of stacked co-packaging assembly of a high-side NMOSFET HS and a low-side NMOSFET LS that include gate, source and drain electrode contacts on both sides of the device. As shown in FIG. 8B, the high-side NMOSFET HS can be stacked on top of the low-side NMOSFET LS. The source of the high-side NMOSFET can be electrically connected to the drain of the low-side NMOSFET with a solder paste SP using the wraparound sidewall contacts as described herein. The low side MOSFET may be mounted onto a printed circuit board (PCB) (not shown) with solder paste SP. Stacking MOSFETs allows for more efficient use of space on the circuit board. By way of example, the gate of the top die can be connected to the bottom of the stack through use of a re-routing electrode (not shown) as described above. Alternatively, the cross-section diagram of FIG. 8B could illustrate two stacked MOSFETs connected in parallel to improve the on-resistance.

As may be seen from the foregoing, embodiments of the present invention can facilitate simple, efficient and cost effective wafer level chip scale packaging of semiconductor devices.

Although the specification shows a vertical power MOSFET, this invention is also applicable to any type of vertical semiconductor device, such as an insulated-gate bipolar transistor (IGBT), a bottom source MOSFET, or a bipolar power transistor, or a vertical diode.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor device comprising:
    a semiconductor substrate having first and second surfaces and a sidewall between the first and second surfaces;
    a first conductive pad on the first surface of the device in electrical contact with a first semiconductor device structure within the substrate;
    a second conductive pad on the second surface of the device in electrical contact with a second semiconductor device structure within the substrate;
    a notch on the sidewall running from the first surface to the second surface, wherein said notch does not extend across the entire length of a die;
    an insulator layer on the first surface and on the sidewall in the notch;
    an electrically conductive layer on part of the insulator layer on the sidewall, wherein the conductive layer is in electrical contact with the second conductive pad, allowing access to the second conductive pad from the first surface, wherein the insulator layer prevents the conductive layer from making contact between the second conductive pad and the sidewall of the semiconductor substrate, wherein a portion of the electrically conductive layer on the sidewall is exposed, whereby electrical contact to the second conductive pad or inspection of the contact can be made from the side of the device via the exposed portion.

2. The semiconductor device of claim 1, wherein the device is a vertical field effect transistor.

3. The semiconductor device of claim 1, further comprising:
    a second notch on a sidewall running from the first surface to the second surface;
    a second insulator layer on the second surface and sidewall in the second notch;
    a second electrically conductive layer on part of the second insulator layer on the sidewall, wherein the second conductive layer is in electrical contact with the first conductive pad, allowing access to the first conductive pad from the second surface.

4. The semiconductor device of claim 3, wherein the second insulator layer and the second conductive layer cover a portion of the second conductive pad on the second surface, the second insulator layer insulating the second conductive pad from said second electrically conductive layer.

5. The semiconductor device of claim 3, further comprising:
    a third conductive pad on the first surface in electrical contact with a third semiconductor device structure within the substrate, wherein the third conductive pad is electrically isolated from the first conductive pad;
    a third notch on a sidewall running from the first surface to the second surface;
    a third insulator layer on the second surface and the third notch;
    a third electrically conductive layer on part of the third insulator layer on the third notch and on the second surface, wherein the third conductive layer is in electrical contact with the third conductive pad, allowing access to the third conductive pad from the second surface, wherein the third insulator layer prevents the third conductive layer from making contact between the third conductive pad and the sidewall of the semiconductor substrate.

6. The semiconductor device of claim 5, wherein the first semiconductor device structure comprises a source region, the second semiconductor device structure comprises a drain region, and the third semiconductor device structure comprises a gate.

7. The semiconductor device of claim 5, wherein the first and third conductive pads are made of the same conductive layer.

8. The semiconductor device of claim 5, wherein each of the first, second and third conductive pads can be accessed from both the first and the second surfaces.

9. The semiconductor device of claim 5, wherein a portion of the first, second and third electrically conductive layers on the sidewalls are exposed, whereby electrical contact to the first, second and third conductive pads or inspection of electrical contact thereto can be made from the side of the device via the exposed portions.

10. The semiconductor device of claim 1 further comprising:
    an additional notch on a semiconductor substrate sidewall running from the first surface to the second surface;
    an additional insulator layer on the sidewall of the additional notch;
    an additional electrically conductive layer on part of the additional insulator layer on the sidewall, wherein the additional electrically conductive layer is electrically isolated from the semiconductor substrate by the additional insulator layer, allowing the additional electrically conductive layer to route an external electrical connection between the first surface and second surface.

11. A wafer level method for manufacturing a plurality of semiconductor devices, comprising:
    a) forming a plurality of semiconductor device dies separated by designated scribe lines on a semiconductor wafer comprising a semiconductor substrate, wherein each device die includes a first conductive pad on a first surface and a second conductive pad on a second surface, wherein the second surface is on the opposite side of the substrate as the first surface and separated by a sidewall, wherein the first conductive pad is in electrical contact with a first semiconductor device structure in the substrate and the second conductive pad is in electrical contact with a second semiconductor device structure in the substrate on a second surface;
    b) forming one or more through holes through the substrate at the scribe lines between adjacent dies, wherein said through holes do not extend across the entire length of a semiconductor die;
    c) forming an insulating layer on a sidewall of one or more of the through holes; and
    d) forming a conductive layer over the insulating layer on the first surface and on the sidewall, wherein the conductive layer is in electrical contact with the second conductive pad allowing access to the second conductive pad from the first surface, wherein the insulator layer prevents the conductive layer from making contact between the second conductive pad and the sidewall of the semiconductor substrate, e) dicing the wafer to form individual semiconductor devices, wherein said dicing includes dividing the through holes into notches wherein a portion of the electrically conductive layer on the sidewall is exposed, whereby electrical contact to the second conductive pad or inspection of the contact can be made from the side of the device via the exposed portion.

* * * * *